(12) United States Patent
Lee et al.

(10) Patent No.: US 9,153,345 B2
(45) Date of Patent: Oct. 6, 2015

(54) ERROR GENERATING APPARATUS FOR SOLID STATE DRIVE TESTER

(71) Applicant: UNITEST INC, Yongin-si, Gyeonggi-do (KR)

(72) Inventors: Eui Won Lee, Seongnam-si (KR); Hyo Jin Oh, Yongin-si (KR)

(73) Assignee: UNITEST INC, Yongin-si, Gyeonggi-do (KR)

( * ) Notice: Subject to any disclaimer, the term of this patent is extended or adjusted under 35 U.S.C. 154(b) by 198 days.

(21) Appl. No.: 13/921,949

(22) Filed: Jun. 19, 2013

(65) Prior Publication Data

US 2014/0047290 A1 Feb. 13, 2014

(30) Foreign Application Priority Data

Aug. 13, 2012 (KR) .......................... 10-2012-0088328

(51) Int. Cl.

| | | |
|---|---|---|
| *G11C 29/10* | (2006.01) | |
| *G06F 11/22* | (2006.01) | |
| *G11C 29/54* | (2006.01) | |
| *G11C 29/56* | (2006.01) | |
| *G11C 29/04* | (2006.01) | |

(52) U.S. Cl.
CPC ............ *G11C 29/10* (2013.01); *G06F 11/2221* (2013.01); *G11C 29/54* (2013.01); *G11C 29/56008* (2013.01); *G11C 2029/0401* (2013.01); *G11C 2029/5602* (2013.01); *G11C 2029/5606* (2013.01)

(58) Field of Classification Search
CPC ................ G11C 2029/5602; G11C 2029/5606

USPC ......................................................... 714/719
See application file for complete search history.

(56) References Cited

U.S. PATENT DOCUMENTS

| | | | | |
|---|---|---|---|---|
| 4,638,481 | A  * | 1/1987 | Crane et al. ................... | 714/743 |
| 5,414,713 | A  * | 5/1995 | Waschura et al. ............. | 714/715 |
| 5,617,531 | A  * | 4/1997 | Crouch et al. ................. | 714/30 |
| 5,951,705 | A  * | 9/1999 | Arkin et al. ................... | 714/738 |
| 5,991,898 | A  * | 11/1999 | Rajski et al. ................... | 714/30 |
| 6,397,361 | B1 * | 5/2002 | Saitoh ............................ | 714/724 |
| 6,449,741 | B1 * | 9/2002 | Organ et al. ................... | 714/724 |
| 6,634,005 | B1 * | 10/2003 | Lindsay et al. ............... | 714/726 |
| 6,684,351 | B1 * | 1/2004 | Bendak et al. ................ | 714/715 |
| 6,751,756 | B1 * | 6/2004 | Hartnett et al. ................ | 714/54 |

(Continued)

FOREIGN PATENT DOCUMENTS

| | | |
|---|---|---|
| KR | 10-2008-0039605 A | 5/2008 |
| KR | 10-2008-0042659 A | 5/2008 |
| KR | 10-2010-0114697 A | 10/2010 |

*Primary Examiner* — Joseph D Torres
(74) *Attorney, Agent, or Firm* — Novick, Kim & Lee, PLLC; Jae Youn Kim

(57) ABSTRACT

Disclosed is an error generating apparatus of a solid state drive tester. The error processing operation of the storage is tested by inserting errors into a specific instruction to be transmitted to the storage, and detecting the results of the error processing operation of the storage when testing the storage. The error generating apparatus includes a host terminal for receiving a test condition for a test of a storage from a user, and a test control unit for generating a test pattern according to the test condition or generating a test pattern randomly, generating error data used to test an error characteristic of the storage, and testing the storage based on the test pattern and a normal instruction or an error instruction which is formed by inserting the error data into the normal instruction.

7 Claims, 6 Drawing Sheets

(56) References Cited

U.S. PATENT DOCUMENTS

| | | | |
|---|---|---|---|
| 6,763,490 B1* | 7/2004 | Krech et al. | 714/738 |
| 7,071,679 B1* | 7/2006 | Sabih et al. | 324/750.3 |
| 7,392,446 B1* | 6/2008 | Simmons et al. | 714/725 |
| 7,420,384 B1* | 9/2008 | Sabih et al. | 324/750.3 |
| 7,734,966 B1* | 6/2010 | Lee et al. | 714/718 |
| 8,001,434 B1* | 8/2011 | Lee et al. | 714/733 |
| 8,065,133 B1* | 11/2011 | Asbridge | 703/23 |
| 8,352,793 B2* | 1/2013 | Lee | 714/30 |
| 8,392,766 B2* | 3/2013 | Chyan | 714/703 |
| 8,467,735 B2* | 6/2013 | Giles et al. | 455/67.11 |
| 8,743,735 B1* | 6/2014 | Bershteyn et al. | 370/254 |
| 2003/0110427 A1* | 6/2003 | Rajsuman et al. | 714/724 |
| 2003/0233208 A1* | 12/2003 | Uesaka et al. | 702/118 |
| 2005/0005210 A1* | 1/2005 | Her et al. | 714/724 |
| 2006/0123296 A1* | 6/2006 | Reichert | 714/731 |
| 2006/0156137 A1* | 7/2006 | Raul et al. | 714/738 |
| 2007/0157059 A1* | 7/2007 | Tsao et al. | 714/733 |
| 2007/0245199 A1* | 10/2007 | Pochowski | 714/742 |
| 2009/0183045 A1* | 7/2009 | Yao et al. | 714/738 |
| 2013/0193993 A1* | 8/2013 | Golov et al. | 324/750.01 |
| 2014/0047287 A1* | 2/2014 | Lee et al. | 714/719 |
| 2014/0047289 A1* | 2/2014 | Lee | 714/719 |

* cited by examiner

ERROR GENERATING APPARATUS FOR SOLID STATE DRIVE TESTER

BACKGROUND OF THE INVENTION

1. Field of the Invention

The present invention relates to an error generating apparatus for a solid state drive tester. In more particularly, the present invention relates to an error generating apparatus for a solid state drive tester, capable of testing an error processing operation of a storage by inserting errors into a specific instruction to be transmitted to the storage and detecting the results of the error processing operation of the storage when testing the storage.

2. Description of the Related Art

Until now, hard disk drives (HDDs) have been most generally known in the art and used as large capacity digital media storage devices. However, recently, as prices of NAND flash semiconductor devices, which can store large data and have a characteristic in which data stored therein are not erased in the power-off state, among semiconductor devices having a memory function are lowered, the large capacity digital media storage apparatus such as solid state drives (SSDs) based on a semiconductor having a memory function are newly appearing.

The SSD represents the writing/reading rate that is three times to five times faster than that of existing HDDs, and has the performance superior to that of the HDDs in that the reading/writing rate for a random address required by a database management system is several hundreds of times faster than that of the HDDs. In addition, since the SSD is operated in a silent way, a noise problem of an existing hard disk can be solved. Further, since the SSD is operated with power consumption significantly lower than that of the HDD, the SSD is known as to most suitable for a digital device, such as a laptop computer, which requires low power consumption.

In addition, the SSD has durability against an external impact stronger than that of the HDD, and the SSD can be manufactured in the smaller and more various shapes as compared with the HDD having a formulaic shape in terms of an external design. Accordingly, the external shape of an electronic product employing the SSD can be made smaller, so that the SSD represents many excellent advantages in the applications thereof.

Due to the advantages, it is expected that the distribution of SSDs can be expanded to searches, home shopping, storage media of video service servers, storage media for storing various R&D materials, and special equipment, as well as existing desktop computers or laptop computers in the future.

In order to test the SSD, an SSD tester according to the related art is disclosed in FIG. 1.

The SSD tester according to the related art as shown in FIG. 1 includes a host terminal 110, a network 120, a test control unit 130, and a memory 140. In FIG. 1, reference numeral 200 denotes a storage unit 200 including a plurality of storages 201 to 200+N which are test targets which are test targets.

The host terminal 110 functions to receive a test condition for storage test from a user, and the network 120 is in charge of a data interface between the host terminal 110 and the test control unit 130.

The memory 140 has a program embedded therein to test the SSD, and acts as a data storage device to store pattern data used for generating test patterns and data which are generated when testing the SSD.

The test control unit 130 tests a storage using a test pattern by adaptively selecting an interface according an interface type of the storage after generating the test pattern according to test conditions or randomly. In this case, preferably, a plurality of devices provided in the test control unit 130 to test the SSD are implemented in the form of one chip by using a field programmable gate array (FPGA).

More preferably, the test control unit 130 is divided into a control unit, which controls the test of the storage, and a test executing unit, which actually performs a test function, in hardware, so that a plurality of storages can be tested in real time.

The test control unit 130 includes a communication interface unit 131 connected to the host terminal 110 through the network 120 to receive user information and to transmit the test result to the host terminal 110, a storage interface unit 132 for interfacing the storage unit 200, and an embedded processor 133 for controlling storage test, and a test executing unit 160 which is connected to the embedded processor 133, generates test patterns for storage test to transmit the test patterns to a storage, and reads the test patterns out of the storage and compares the test patterns of the storage with the generated test patterns to determine the failure state of the storage test.

In addition, as shown in FIG. 2, the test executing unit 160 includes a pattern data generator 161, which generates pattern data by selecting one of pattern data generated under the test conditions and randomly-generated pattern data according to a pattern data selection signal output from the embedded processor 133, a buffer memory 162, which temporarily stores data read out of the storage, a failure processor 163, which compares the pattern data generated from the pattern data generator 161 with the read data temporarily stored in the buffer memory 162 to determine a failure, and generates failure information in case of a failure, a failure memory 164, which stores the failure information generated from the failure processor 163, and an instruction generator 165 which transmits a test instruction generated from the embedded processor 133 to the storage interface unit 132.

In addition, the storage interface unit 132 includes a plurality of multi-interfaces 151 to 151+N used to simultaneously test a plurality of storages. Hereinafter, since the multi-interface 151 has the same internal structure and operation, only one multi-interface 151 will be representatively described for the convenience of the explanation.

As shown in FIG. 3, the multi-interface 151 includes an advanced host controller interface (AHCI) unit 151a for interfacing instruction data generated in the embedded processor 133, a direct memory access (DMA) unit 151b for interfacing writing data generated in the embedded processor 133, a serial-ATA (SATA) interface unit 151c for supporting an SATA interface between the AHCI unit 151a and the storage 201, and between the DMA unit 151b and the storage 201, a serial attached SCSI (SAS) interface unit 151d for supporting an SAS interface between the advanced host controller interface 151a and the storage 201 and between the direct memory access unit 151b and the storage 201, a PCI express (PCIe) interface unit 151e for supporting a PCIe interface between the AHCI unit 151a and the storage 201 and between the DMA unit 151b and the storage 201, and a multiplexer (MUX) 151f for selecting one of the SATA interface unit 151c, the SAS interface unit 151d, and the PCIe interface unit 151e according to an interface selection signal generated from the embedded processor 133 to connect the storage 201 and the embedded processor 133.

In the state that the test devices of the SDD having the above structure are provided in the form of one chip on one board through the FPGA, a user connects the SSD tester to a storage to be tested, inputs test condition through the host terminal 110, and then inputs a macro instruction used to test the storage through the host terminal 110 in order to test the SSD. The test condition may include an interface selection signal for the interface with the storage to be tested, and a test pattern selection signal. The test pattern selection signal is used to determine if preset pattern data are selected or if randomly-generated pattern data are selected.

The test condition and the macro instruction input by the user through the host terminal 110 are transferred to the test control unit 130 prepared in the form of one chip through the network 120.

The communication interface unit 131 of the test control unit 130 receives the test condition and the macro instruction, which are input by the user through the network 120, and transmits the test condition and the macro instruction to the embedded processor 133. If the test condition is input by the user and a storage test is requested, the embedded processor 133 extracts a test program for the storage test from the memory 140 to start the storage test. In this case, as an initial operation of the test, the embedded processor 133 extracts test pattern data corresponding to the test condition input by the user from the memory 140 and transmits the test pattern data to the test executing unit 160.

The test executing unit 160 is prepared by realizing a module for actually performing a test in the form of a logic separated from the embedded processor 133. As described above, the load of the embedded processor 133 can be reduced by separating the module for performing the test (generating test pattern data and determining failure) from the embedded processor 133. Accordingly, a plurality of storages can be simultaneously controlled and tested, so that the whole test time can be reduced.

In more detail, as shown in FIG. 2, the pattern data generator 161 of the test executing unit 160 generates pattern data by selecting one of pattern data generated corresponding to the test conditions and randomly-generated pattern data according to the pattern data selection signal output from the embedded processor 133.

The pattern data are transmitted to the multi-interface 151 of the storage interface unit 132. In addition, the instruction data output from the embedded processor 133 to perform the storage test are transmitted to the multi-interface 151 after passing through the instruction generator 165.

The multi-interface 151 selects an interface corresponding to the storage 201 according to the interface selection signal output from the embedded processor 133, transforms the pattern data and the test instruction in the form suitable for the selected interface, and transmits the pattern data and the test instruction to the storage 201.

In this case, as shown in FIG. 3, an interface selection signal is provided to the multi-interface 151 so that the interface corresponding to the storage 201 may be selected.

For example, the interface selection signal is applied to the multiplexer 151f of the multi-interface 151 from the embedded processor 133, and the multiplexer 151f selects one of the interfaces (SATA, SAS, and PCIe) according to the interface selection signal. In other words, the multiplexer 151f selects an interface corresponding to the interface of the storage 201.

In other words, the instruction data for the storage test output from the embedded processor 133 are input to the SATA interface unit 151c, the SAS interface unit 151d, and the PCIe interface unit 151e through the instruction generator 165 and the AHCI unit 151a.

The writing data (test patterns) output from the pattern data generator 161 of the test executing unit 160 are input to the SATA interface unit 151c, the SAS interface unit 151d, and the PCIe interface unit 151e respectively through the direct memory access (DMA) unit 151b.

If the instruction data and the writing data are input to the interfaces in this way, the multiplexer 151f selects only one interface according to an interface selection signal. Thereafter, the selected interface unit transmits the input instruction data and the input writing data to the storage 201, so that the test for the storage 201 is started. For example, when the storage 201 employs an SATA interface, the SATA interface unit 151c is selected, so that the instruction data and writing data input to the SATA interface 151c are transformed into a format suitable for the SATA interface and applied to the storage 201.

In this case, since the SATA interface, the SAS interface, and the PCIe interface employ standard interfaces, the details thereof will be omitted.

After the writing data and the instruction data have been transmitted to the storage 201, if the test of the storage 201 is started, the result data for the test of the storage 201 are readout in response to a read instruction, and the readout data are transmitted to the test executing unit 160 after sequentially passing through the multi-interface 151 and the embedded processor 133.

The buffer memory 162 of the test executing unit 160 temporarily stores the readout data. If the readout data have been completely stored, the failure processor 163 compares expectation data (pattern data) output from the pattern data generator 161 with the readout data received from the embedded processor 133 according to channels by using a comparator embedded therein. If the expectation data are the same as the read data, the failure processor 163 does not output the result. If the expectation data differ from the read data, the failure processor 163 generates a failure signal.

An internal failure counter increases an internal failure count value by 1 based on the failure signal and outputs the internal count value, and an internal failure memory address generator generates a failure memory address to be transmitted to the failure memory 164.

The failure memory 164 uses the internal failure memory address into a logical block address (LBA) and stores the expectation data and the readout data input into the failure processor 163 as failure information.

The failure of the storage test is not processed in the embedded processor 133, but processed in the test executing unit 160 realized in the form of a logic separated from the embedded processor 133. If necessary, a plurality of pattern data are simultaneously generated and the failure states of a plurality of storages are simultaneously determined. Accordingly, the load of the embedded processor 133 can be reduced. In addition, since the storages are simultaneously tested, the storage test time can be reduced.

In addition, the failure information stored in the failure memory 166 is transmitted to the embedded processor 133 according to the request of the embedded processor 133, and transmitted to the host terminal 110 through the communication interface unit 131 and the network 120.

Therefore, a user can easily recognize the test result of the storage through the host terminal 110.

However, according to the related art, since only normal data for a storage test are transmitted in order to test the storage, various characteristics of the storage cannot be tested.

In other words, error data and instructions cannot be transmitted to the storage, and the error processing of the storage cannot be tested.

In addition, when the storage is tested, various types of errors cannot be generated. Accordingly, various characteristics, such as the operation of the storage against errors and an error processing operation of the storage, cannot be tested.

SUMMARY OF THE INVENTION

Accordingly, the present invention has been made keeping in mind the above problems occurring in the prior art, and an object of the present invention is to provide an error generating apparatus for a solid state drive tester, capable of testing an error processing operation of a storage by inserting errors into a specific instruction to be transmitted to the storage and detecting the result of the error processing operation of the storage when testing the storage.

Another object of the present invention is to provide an error generating apparatus for a solid state drive tester, capable of testing various characteristics of a storage, such as the operation of the storage against errors and an error processing operation of the storage by generating various types of errors when testing the storage.

In order to accomplish the above objects, there is provided an error generating apparatus of a solid state drive tester. The error generating apparatus includes a host terminal for receiving a test condition for a test of a storage from a user, and a test control unit for generating a test pattern according to the test condition or generating a test pattern randomly, generating error data used to test an error characteristic of the storage, and testing the storage based on the test pattern and a normal instruction or an error instruction which is formed by inserting the error data into the normal instruction.

The test control unit includes an embedded processor for controlling the test of the storage and insertion of the error data, an error generator for generating the error data used to test the error characteristic of the storage, and a test executing unit for generating the test pattern used to test the storage according to a control of the embedded processor, transmitting a specific instruction generated from the embedded processor or the error instruction, which is formed by inserting the error data into the specific instruction, to the storage, reading a test pattern out of the storage, and comparing the stored test pattern with the generated test pattern in real time to process a test failure state.

The test control unit further includes a communication interface unit connected to the host terminal through a network to receive user information and to transmit a test result to the host terminal, and a storage interface unit for interfacing the storage.

The test executing unit includes a pattern data generator for generating the pattern data by selecting one of the pattern data generated according to the test condition and the randomly-generated pattern data according to a pattern data selection signal output from the embedded processor, a buffer memory for temporarily storing data read out from the storage, a failure processor for comparing the pattern data generated from the pattern data generator with the readout data output from the buffer memory to determine a failure state, and generating failure information in a test failure case, a failure memory for storing failure information generated from the failure processor, a normal instruction generator for generating the normal instruction to test the storage according to a test instruction generated from the embedded processor, an error instruction generator for generating the error instruction by inserting the error data according to the test instruction generated from the embedded processor, and an instruction selector for selecting and outputting the normal instruction generated from the normal instruction generator or the error instruction generated from the error instruction generator according to an instruction selection signal output from the embedded processor.

The storage interface unit includes a plurality of complex interfaces. Each complex interface includes an advanced host controller interface (AHCI) unit for interfacing instruction data generated from the embedded processor, a direct memory access (DMA) unit for interfacing writing data generated from the embedded processor, a serial-ATA (SATA) transport layer for supporting a transport layer protocol of an SATA interface between the advanced host controller interface unit and the storage, and between the direct memory access unit and the storage, a serial attached SCSI (SAS) transport layer for supporting a transport layer protocol of an SAS interface between the advanced host controller interface unit and the storage, and between the direct memory access unit and the storage, a PCI express (PCIe) transaction layer for supporting a transaction layer protocol of a PCI express interface between the advanced host controller interface unit and the storage, and between the direct memory access unit and the storage, a serial attached SCSI (SAS) port layer for making a data interface between the serial attached SCSI transport layer and a link layer, a sharing link layer for allowing the SATA transport layer, the SAS port layer, and the PCIe transaction layer to share a link layer protocol, and a physical layer for performing a physical layer interface operating between the sharing link layer and the storage.

The complex interface further includes a serial-ATA (SATA) transport layer error generator for generating error data of the serial-ATA transport layer under the error insertion control of the embedded processor to transmit the error data to the serial-ATA transport layer, a serial attached SCSI (SAS) transport layer error generator for generating error data of the serial attached SCSI transport layer under the error insertion control of the embedded processor to transmit the error data to the serial attached SCSI transport layer, a PCI express (PCIe) transaction layer error generator for generating error data of the PCI express transaction layer under the error insertion control of the embedded processor to transmit the error data to the PCI express transaction layer, a serial attached SCSI (SAS) port layer error generator for generating error data of the serial attached SCSI port layer under the error insertion control of the embedded processor to transmit the error data to the serial attached SCSI port layer, a sharing link layer error generator for generating error data of the sharing link layer under the error insertion control of the embedded processor to transmit the error data to the sharing link layer, and a physical layer error generator for generating error data of the physical layer under the error insertion control of the embedded processor to transmit the error data to the physical layer.

The embedded processor transmits an error insertion control instruction to all of the serial-ATA transport layer error generator, the serial attached SCSI transport layer, the PCI express transaction layer error generator, the serial attached SCSI port layer error generator, the sharing link layer error generator, and the physical layer error generator.

The embedded processor selectively transmits an error insertion control instruction to a part of the serial-ATA transport layer error generator, the serial attached SCSI transport layer error generator, the PCI express transaction layer error generator, the serial attached SCSI port layer error generator, the sharing link layer error generator, and the physical layer error generator, such that only the selected error generator generates the error data, and the error data are inserted in a layer corresponding to the selected error generator.

As described above, according to the present invention, the error processing operation of a storage can be tested by inserting errors into the specific instruction to be transmitted to the storage and detecting the result of the error processing operation of the storage when testing the storage.

In addition, according to the present invention, various characteristics of a storage, such as the operation of the storage and an error processing operation of the storage, can be tested by generating various types of errors when testing the storage.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinafter, an exemplary embodiment of the present invention will be described in detail with reference to the accompanying drawings. A detailed description of known functions and configurations of the present invention will be omitted when it may make the subject of the present invention unclear.

Figure 1:
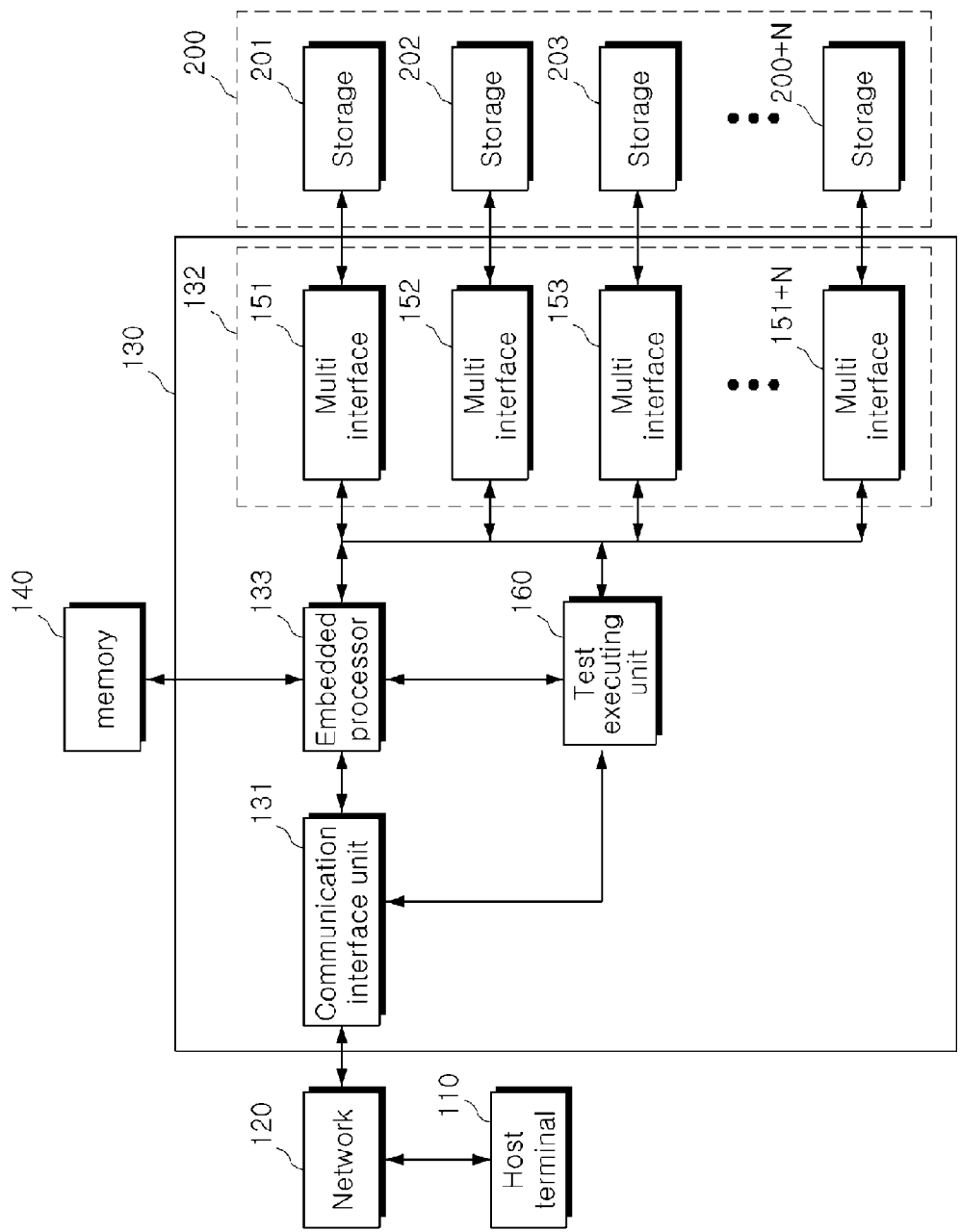
FIG. 1 is a schematic block diagram showing a solid state drive tester.
Figure 2:
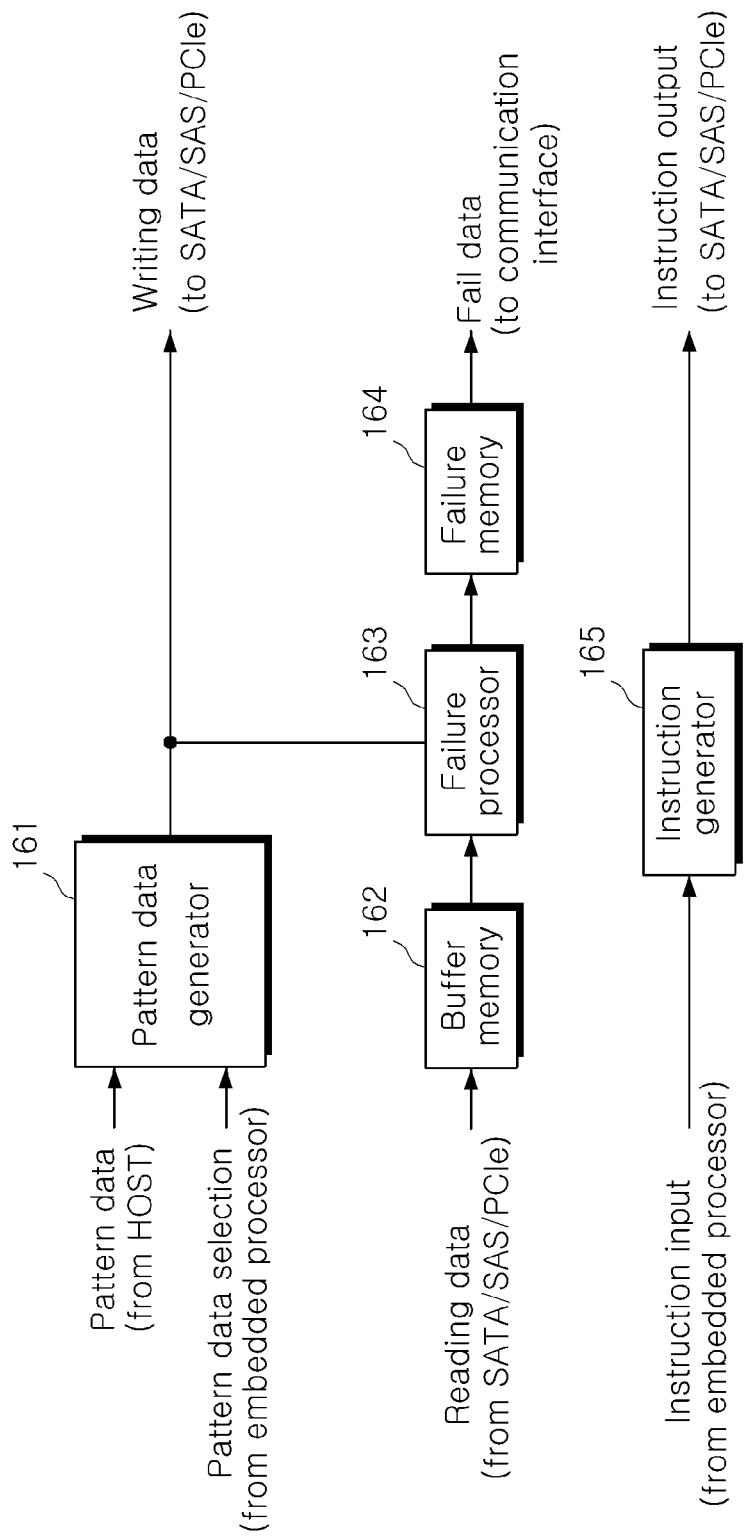
FIG. 2 is a block diagram showing the embodiment of a test executing unit of FIG. 1.
Figure 3:
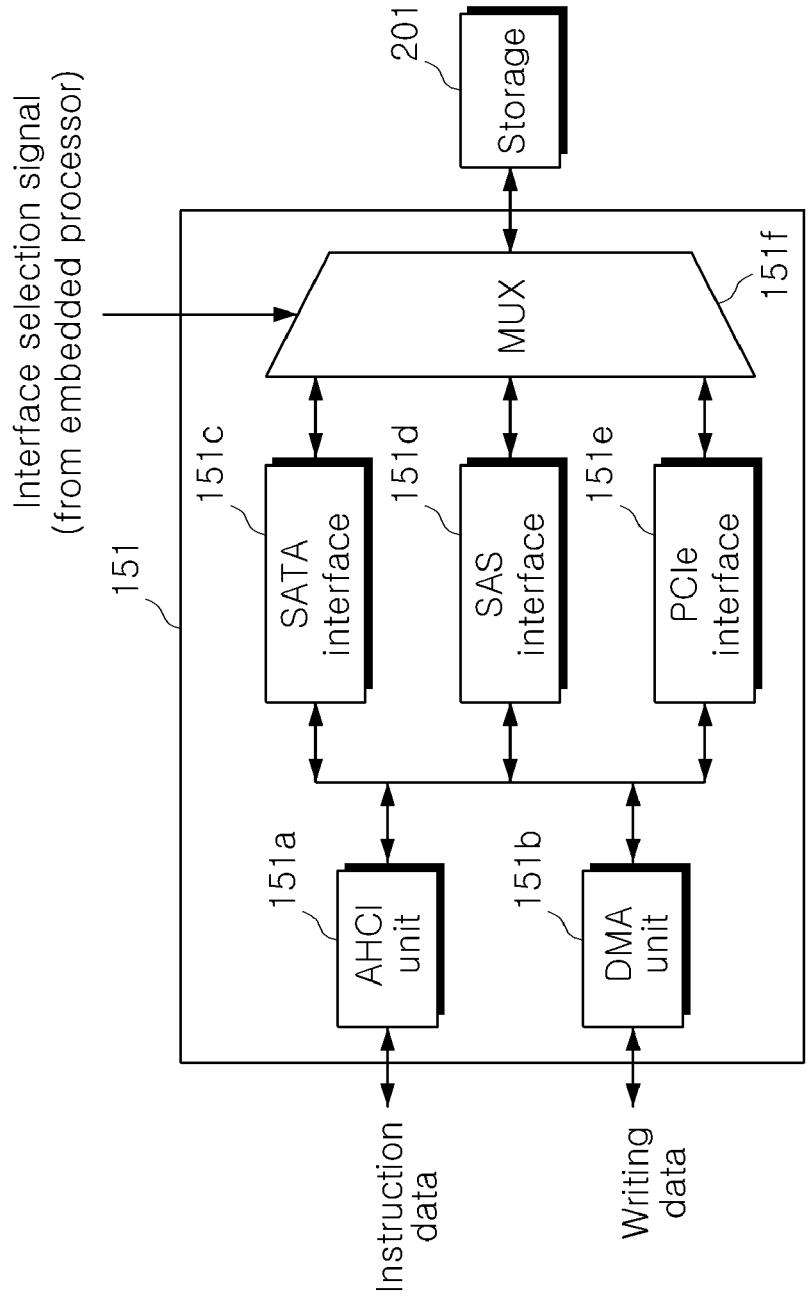
FIG. 3 is a block diagram showing the embodiment of a multi-interface of FIG. 1.
Figure 4:
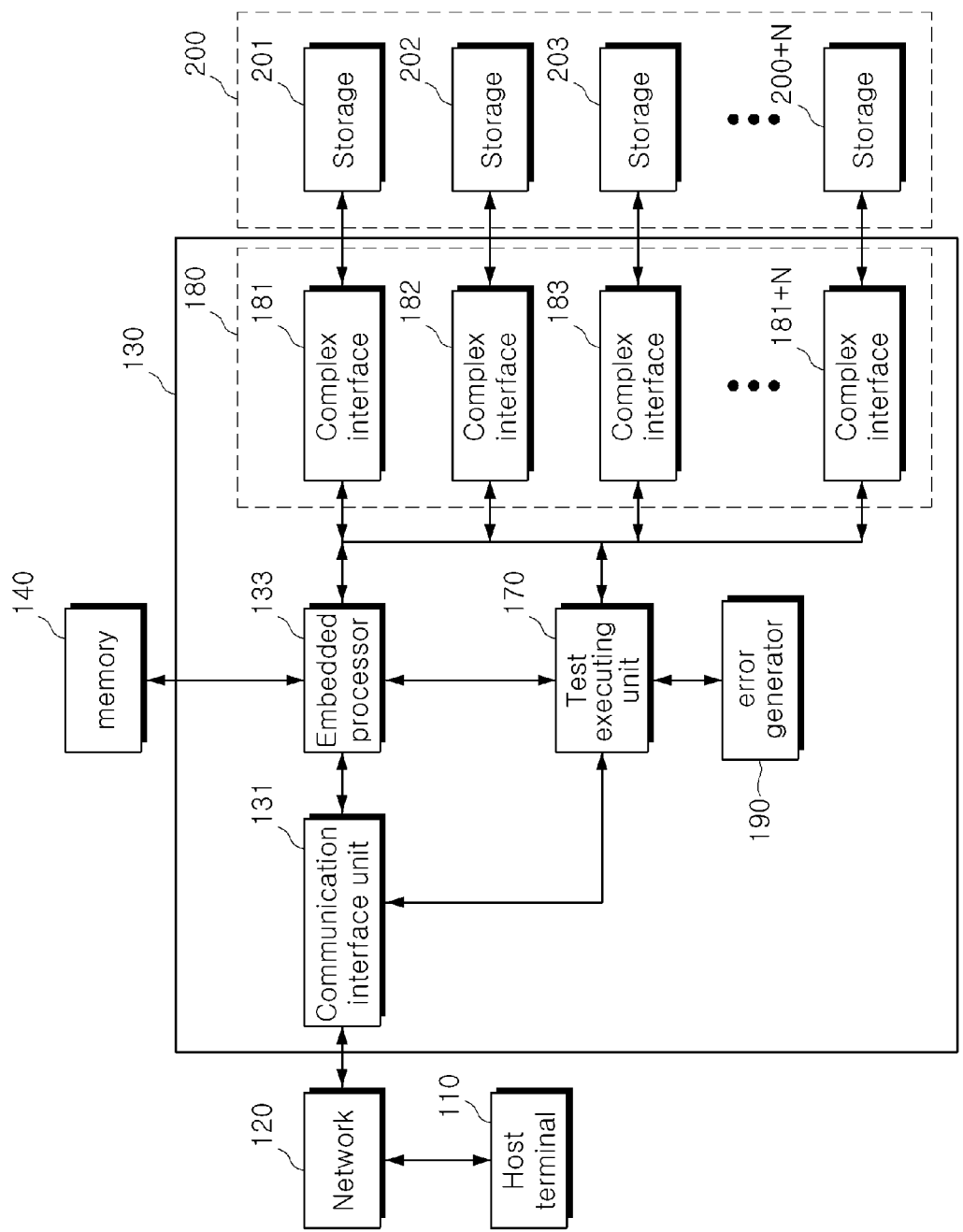
FIG. 4 is a block diagram showing an error generating apparatus for a solid state drive tester according to the present invention.

FIG. 4 is a block diagram showing an error generating apparatus for a solid state driver tester. The error generating apparatus includes a host terminal 110, a network 120, a test control unit 130, and a memory 140. In FIG. 4, reference numeral 200 denotes a storage unit 200 including a plurality of storages 201 to 200+N which are test targets.

The host terminal 110 receives a test condition for storage test from a user, and the network 120 is in charge of a data interface between the host terminal 110 and the test control unit 130.

The memory 140 has a program embedded therein to test the SSD, and acts as a data storage device to store pattern data used for generating test patterns and data which are generated when testing the SSD.

The test control unit 130 generates a test pattern according to the test condition, or randomly generates a test pattern. In addition, the test control unit 130 generates error data used to test the error characteristics of the storage 201, and tests the storage 201 based on the test pattern and a normal instruction, or an error instruction formed by inserting error data into the normal instruction. In this case, preferably, the test control unit 130 has a structure in which a plurality of devices for an SSD test are implemented in the form of one chip through a field programmable gate array (FPGA). The error characteristics include an operating characteristic representing the operation of the storage 201 according to the error instruction and an error processing characteristic representing an error processing operation by the storage 201 according to the error instruction.

More preferably, the test control unit 130 is divided into a control module, which controls the test of the storage 201, and a test execution module, which actually performs a test function, in hardware, so that a plurality of storages can be tested in real time.

The test control unit 130 includes a communication interface unit 131 connected to the host terminal 110 through the network 120 to receive user information and to transmit the test result to the host terminal 110, a storage interface unit 180 for interfacing the storage unit 200, and an embedded processor 133 for controlling the test of the storage 201, an error generator 190 for generating error data used to test the error characteristics of the storage 201, and a test executing unit 170 for generating test patterns for storage test under the control of the embedded processor 133, transmitting a specific instruction, which is generated from the embedded processor 133, or an error instruction, which is formed by inserting error data into the specific instruction, to the storage 201, and comparing test patterns read out from the storage 201 with the generated test patterns in real time to process the failure state of the test for the storage 201.

Figure 5:
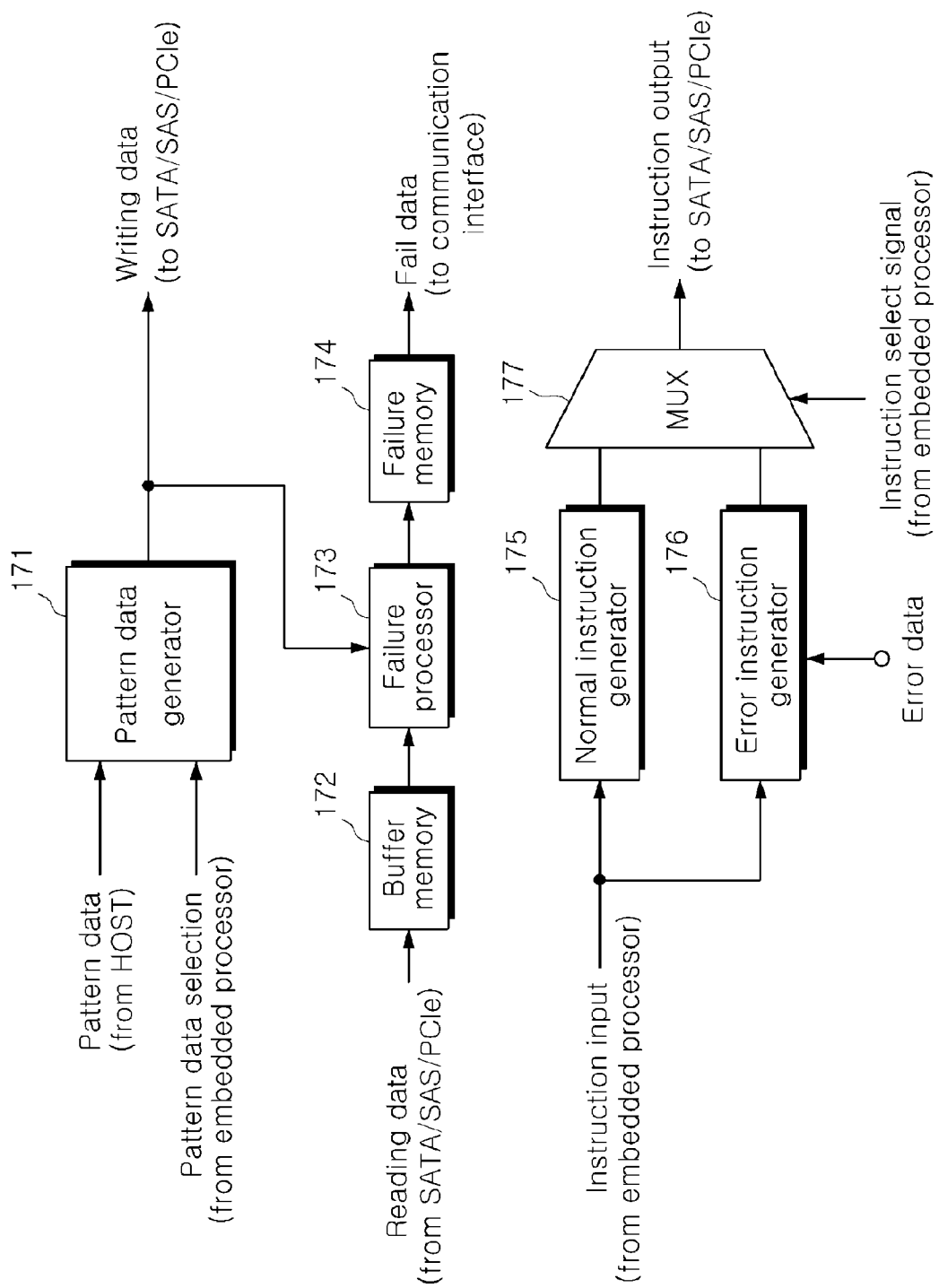
FIG. 5 is a block diagram showing the embodiment of a test executing unit of FIG. 4.

In addition, as shown in FIG. 5, the test executing unit 170 includes a pattern data generator 171, which generates pattern data by selecting one of pattern data generated under the test conditions and randomly-crated pattern data according to a pattern data selection signal output from the embedded processor 133, a buffer memory 172, which temporarily stores data read out from the storage 201, a failure processor 173, which compares the pattern data generated from the pattern data generator 171 with the data read out of the buffer memory 172 to determine the test failure of the storage 201, and generates failure information in case of the test failure of the storage 201, a failure memory 174, which stores the failure information generated from the failure processor 173, a normal instruction generator 175, which generates the normal instruction for the test of the storage 201 according to a test instruction generated from the embedded processor 133, an error instruction generator 176, which generates the error instruction by inserting the error data into the test instruction generated from the embedded processor 133, and an instruction selector 177 selectively outputting the normal instruction generated from the normal instruction generator 175 or the error instruction generated from the error instruction generator 176. The instruction selector 177 is preferably realized by using a multiplexer.

In addition, the storage interface unit 180 includes a plurality of complex interfaces 181 to 181+N to simultaneously test a plurality of storages. Hereinafter, since the complex interfaces 181 to 181+N have the same internal structure and operation, only one multi-interface 181 will be representatively described for the convenience of the explanation.

Figure 6:
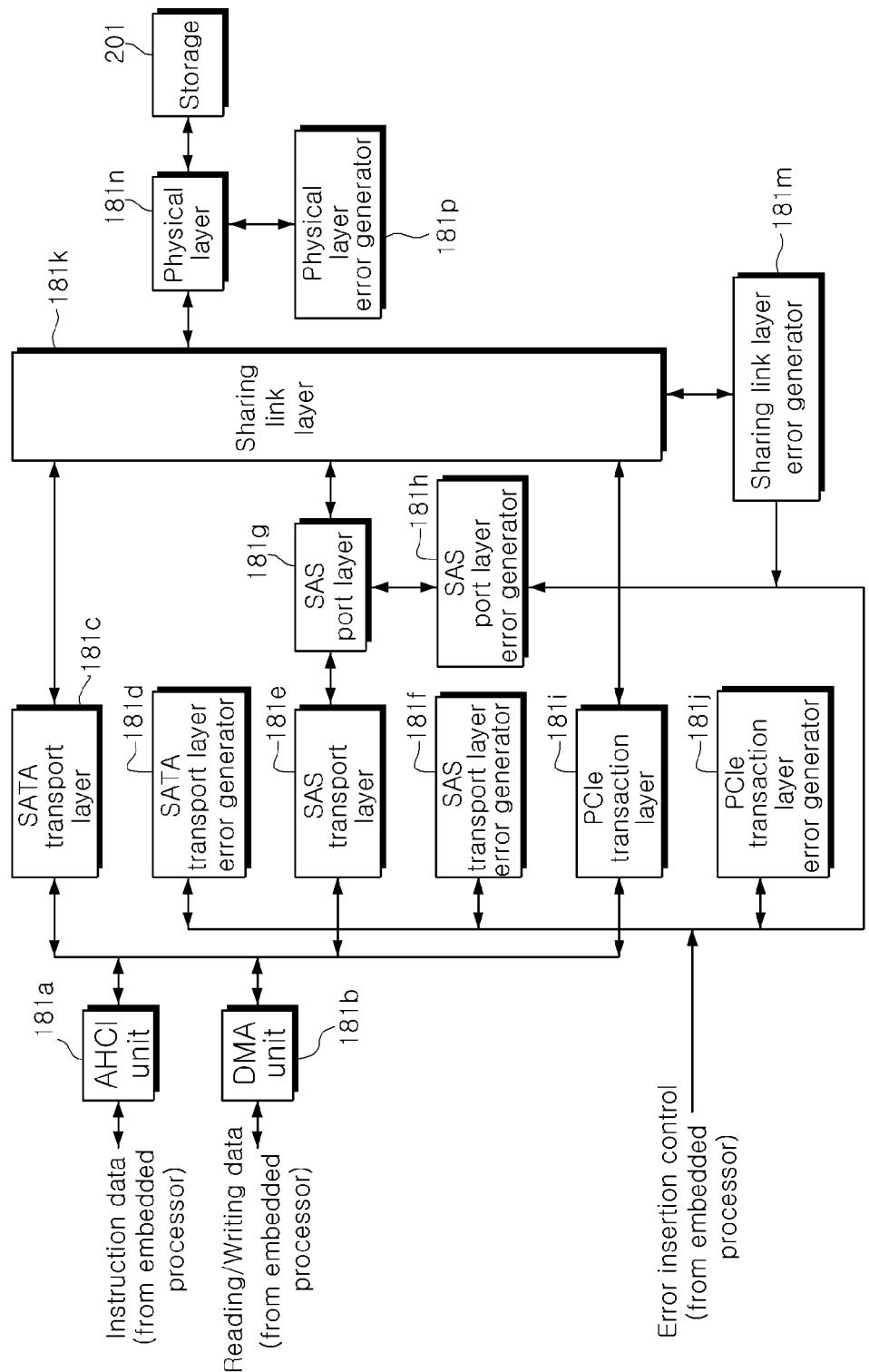
FIG. 6 is a block diagram showing the embodiment of a complex interface of FIG. 4.

As shown in FIG. 6, the complex interface 181 includes an advanced host controller interface (AHCI) unit 181a for interfacing instruction data generated from the embedded processor 133, a direct memory access (DMA) unit 181b for interfacing writing data generated from the embedded processor 133, a serial-ATA (SATA) transport layer 181c for supporting a transport layer protocol of an SATA interface between the AHCI unit 181a and the storage 201 and between the DMA unit 181b and the storage 201, a serial attached SCSI (SAS) transport layer 181e for supporting a transport layer protocol of an SAS interface between the AHCI unit 181a and the storage 201 and the DMA unit 181b and the storage 201, a PCT express (PCIe) transaction layer 181i for supporting a transaction layer protocol of a PCIe interface between the AHCI unit 181a and the storage 201, and between the DMA unit 181b and the storage 201, an SAS port layer 181g for performing a data interface between the SAS transport layer 181e and a link layer, a sharing link layer 181k for allowing the SATA transport layer 181c, the SAS port layer 181g, and the PCIe transaction layer 181e to share the link layer protocol, and a physical layer 181*n* for performing a physical layer interface between the sharing link layer 181*g* and the storage 201.

Preferably, the complex interface 181 further includes an SATA transport layer error generator 181*d* generating error data of the SATA transport layer 181*c* under the error insertion control of the embedded processor 133 to transmit the error data to the SATA transport layer 181*c*, an SAS transport layer error generator 181*f* generating error data of the SAS transport layer 181*e* under the error insertion control of the embedded processor 133 to transmit the error data to the SAS transport layer 181*e*, a PCIe transaction layer error generator 181*j* generating error data of the PCIe transaction layer 181*i* under the error insertion control of the embedded processor 133 to transmit the error data to the PCIe transaction layer 181*i*, an SAS port layer error generator 181*h* generating error data of the SAS port layer 181*g* under the error insertion control of the embedded processor 133 to transmit the error data to the SAS port layer 181*g*, a sharing link layer error generator 181*m* generating error data of the sharing link layer 181*k* under the error insertion control of the embedded processor 133 to transmit the error data to the sharing link layer 181*k*, and a physical layer error generator 181*p* generating error data of the physical layer 181*n* under the error insertion control of the embedded processor 133 to transmit the error data to the physical layer 181*n*.

In the state that the error generating apparatus of the SDD tester having the above structure according to the present invention including a plurality of test devices for storage test provided in the form of one chip on one board through an FPGA, a user testing the SSD connects the SSD tester to a storage to be tested, inputs test condition and a macro instruction used to test the storage through the host terminal 110 so that the SSD is tested. The test condition may include an interface selection signal for the interface with the storage to be tested, and a test pattern selection signal. The test pattern selection signal is used to determine if preset pattern data are selected or if a plurality of pattern data randomly generated are selected.

The test condition and the macro instruction input by the user through the host terminal 110 are transmitted to the test control unit 130 prepared in the form of one chip through the network 120.

The communication interface unit 131 of the test control unit 130 receives the test condition and the macro instruction, which are input by the user through the network 120, and transmits the test condition and the macro instruction to the embedded processor 133. If the test condition is input by the user and a storage test is requested, the embedded processor 133 extracts a test program for the storage test from the memory 140 to start the storage test. In this case, as an initial operation of the test, the embedded processor 133 extracts test pattern data corresponding to the test condition input by the user from the memory 140 and transmits the test pattern data to the test executing unit 170.

The test executing unit 170 is prepared by realizing a module for actually performing a test in the form of a logic separated from the embedded processor 133. As described above, the load of the embedded processor 133 can be reduced by separating the module for performing the test (generating test pattern data and determining test failure) from the embedded processor 133. Accordingly, a plurality of storages can be simultaneously controlled and tested, so that the whole test time can be reduced.

In more detail, as shown in FIG. 5, the pattern data generator 171 of the test executing unit 170 generates pattern data by selecting one of pattern data generated corresponding to the test conditions and randomly-created pattern data according to the pattern data selection signal output from the embedded processor 133.

In other words, although not shown in drawings, the pattern data generator 171 is provided therein with a pattern data memory, a pattern data creating unit, and a multiplexer. The pattern data memory stores pattern data generated corresponding to the test condition, and the multiplexer outputs the pattern data, and the pattern data creating unit randomly generates the pattern data (the form of pseudo random binary sequence (PRBS)) to transmit the pattern data to the multiplexer.

In this case, preferably, the pattern data creating unit may include a plurality of pattern data creators to randomly create pattern data. For example, the pattern data creating unit includes an 8-bit pattern data creator, a 16-bit pattern data creator, a 24-bit pattern data creator, or 32-bit pattern data creator.

The multiplexer selects one of pattern data, which are stored in the pattern data memory, and pattern data, which are randomly generated through the pattern data generator, according to the pattern data selection signal generated from the embedded processor 133 and transmits the pattern data to the complex interface 181 of the storage interface unit 180. When a plurality of storages are simultaneously tested, the pattern data are transmitted to the complex interface through a plurality of channels.

Meanwhile, according to the present invention, various characteristic tests are possible in relation to the operation of the storage 201 by errors, the error processing operation of the storage 201, and the like. To this end, various types of error data are generated through the error generator 190. In this case, the error data may be previously generated or may be randomly generated in real time. The error data generated in the error generator 190 are transmitted to the test executing unit 170.

In addition, test instruction data generated from the embedded processor 133 are input to the normal instruction generator 175 and the error instruction generator 176 of the test executing unit 170 respectively. The normal instruction generator 175 generates a specific normal instruction according to the test instruction and transmits the normal instruction to the instruction selector 177 like that of the related art. The error instruction generator 176 generates an error instruction by inserting error data, which are generated in the error generator 190, into the normal instruction and transmits the error instruction to the instruction selector 177.

In addition, the embedded processor 133 may select the normal instruction or the error instruction according to the request of the user performing the storage test, and transmits an instruction selection signal to the instruction selector 177 in order to select the instruction.

The instruction selector 177 selects one of the normal instruction and the error instruction and transmits the selected instruction to the complex interface 181. In this case, the instruction selector 177 may easily select a specific instruction by using the multiplexer.

As shown in FIG. 6, the complex interface 181 inputs the instruction data which are output from the embedded processor 133 in order to test the storage 201, to the SATA transport layer 181*c*, the SAS transport layer 181*e*, and the PCIe transaction layer 181*i* respectively through the AHCI unit 181*a*.

The writing data output from the embedded processor 133 are input to the SATA transport layer 181*c*, the SAS transport layer 181*e*, and the PCIe transaction layer 181*i* respectively through the DMA unit 181*b*.

In addition, the embedded processor 133 may insert error data in each layer of the complex interface 181 by applying an error insertion control instruction (error insertion control) to the complex interface 181. In order to insert errors in each layer, errors may be inserted in all layers, or may be inserted in a specific layer. For example, errors may be inserted in all layers by simultaneously transmitting the error insertion control instruction to the SATA transport layer error generator 181d, the SAS transport layer error generator 181f, the PCIe transaction layer error generator 181j, the SAS port layer error generator 181h, the sharing link layer error generator 181m, and the physical layer error generator 181p, or may be selectively inserted in only a specific layer by selectively transmitting the error insertion control instruction to only a layer requiring error insertion among the plural layers.

In this case, the SATA transport layer error generator 181d, the SAS transport layer error generator 181f, the PCIe transaction layer error generator 181j, the SAS port layer error generator 181h, the sharing link layer error generator 181m, and the physical layer error generator 181p may generate preset error data or randomly generate error data in real time. The error data intentionally make CRC, scramble, FIS, and received FIS data erroneous.

If the instruction data and the writing data output from the embedded processor 133 are input to the transport layers and the transaction layers respectively, each layer processes the instruction data and the writing data through a related layer protocol only if the related interface is selected.

For example, when the input instruction data and writing data have the format suitable for the SATA interface, the SATA transport layer 181c processes the instruction data and the writing data by using the related protocol. In the case of error insertion, the error data generated from the SATA transport layer error generator 181d are inserted into the instruction data and the writing data to make CRC, scramble, FIS, or received FIS data error and transmit the error data to the sharing link layer 181k.

When the input instruction data and writing data have the format suitable for the SAS interface, the SAS transport layer 181e processes the instruction data and the writing data by using the related protocol. In the case of error insertion, the error data generated from the SAS transport layer error generator 181f are inserted into the instruction data and the writing data to make CRC, scramble, FIS, or received FIS data error and transmit the error data to the SAS port layer 181g. The SAS port layer 181g transmits the received instruction data and the received writing data to the sharing link layer 181k. In the case of error insertion, after inserting error data generated from the SAS port layer error generator 181h into the data, the data are transmitted to the sharing link layer 181k.

In addition, when the input instruction data and writing data have the format suitable for the PCIe interface, the PCIe transaction layer 181i processes the instruction data and the writing data by using the related protocol. Then, in the case of error insertion, the error data generated from the PCIe transaction layer error generator 181j are inserted into the instruction data and the writing data to make CRC, scramble, FIS, or received FIS data error and then transmit the error data to the sharing link layer 181k.

The sharing link layer 181k processes the instruction data and the writing data, which are received from the SATA transport layer 181c, the SAS transport layer 181e, or the PCIe transaction layer 181i, by using a single link protocol. In the case of the error insertion, the error data generated from the sharing link layer error generator 181m are inserted into the instruction data and the writing data and transmitted to the physical layer 181n.

The physical layer 181n converts the input instruction data and the input writing data into physical signals suitable for the storage 201 and transmits the physical signals to the storage 201. In the case of error insertion, the error data generated from the physical layer error generator 181p are inserted into the instruction data and the writing data, and the instruction data and the writing data are converted into the physical signal to be transmitted to the storage 201.

For example, according to the interface scheme of the related art, storages and interfaces are implemented by realizing a transport layer, a link layer, and a physical layer in a separate SATA interface unit for an SATA interface, realizing a transport layer, a port layer, a link layer, and a physical layer in a separate SAS interface unit for an SAS interface, and realizing a transport layer, a link layer, and a physical layer in a separate PCIe interface unit for a PCIe interface. In this case, as protocols are realized in respective interfaces, a size of an entire interface apparatus becomes larger, and, as a large number of devices are realized separately, much heat is generated and the number of gate counts increases.

In order to solve the above problem, the present invention realizes a plurality of complex interfaces, and is designed such that protocols realized in the interfaces in the same way, that is, protocols on the link layer and the physical layer are shared mutually, and only protocols (transport layer protocol or transaction layer protocol) which are not shared by the interfaces are realized separately, whereby a whole size of the interface apparatus can be reduced and the number of gate counts is reduced through reduction of the interface apparatus, thereby reducing heat and noise.

In addition, the interface unit according to the present invention simultaneously causes errors in all layers or causes errors in only a specific layer.

After the instruction data and the writing data have been recorded in the storage 201 through the above procedure, the test result data of the storage 201 are read out in response to the read instruction, and the readout data are transmitted to the test executing unit 170 in the order inverse to the order of the writing operation.

For example, after receiving the readout data through the physical layer 181n of the complex interface 181, the readout data are transmitted to the sharing link layer 181k, and the sharing link layer 181k processes the read data received therein from the physical layer 181n. Then, the readout data are transmitted to the SATA transport layer 181c, the SAS transport layer 181e, and the PCIe transaction layer 181i.

Thereafter, the SATA transport layer 181c, the SAS transport layer 181e, or the PCIe transaction layer 181i operates and performs an interfacing operation for input read data only if the input read data have a related interface format. For example, if the interface type of the storage 201 is the SATA interface, only the SATA transport layer 181c operates and transmits the read data to the AHCI unit 181a and the DMA unit 181b. In addition, if the interface type of the storage 201 is the SAS interface, only the SAS transport layer 181e operates and transmits the read data to the AHCI unit 181a and the DMA unit 181b. Further, if the interface type of the storage 201 is the PCIe interface, only the PCIe transaction layer 181i operates and transmits the read data to the AHCI unit 181a and the DMA unit 181b.

Storage response data and read data output through the AHCI unit 181a and the DMA unit 181b are transmitted to the embedded processor 133 and temporarily stored in the buffer memory 172 through the embedded processor 133. Thereafter, the storage response data and the read data are transmitted to the failure processor 173.

The failure processor 173 compares the expectation data (writing data) read out from the pattern data generator 171 with the readout data (reading data). If the expectation data are the same as the readout data, the output of the failure processor 173 is not generated. If the expectation data differ from the readout data, the failure signal is generated from the failure processor 173.

The failure memory 174 stores expectation data and readout data input to the failure processor 173 as failure information by using the transferred address as a logical block address (LBA) according to the generated failure signal.

Further, the failure information stored in the failure memory 174 is transmitted to the embedded processor 133 according to the request of the embedded processor 133, and transmitted to the host terminal 110 through the communication interface unit 131 and the network 120.

Thus, the user can easily recognize the test result (the state of the storage, the operating characteristic of the storage against errors, the error processing situation, and the like) of the storage tested through the host terminal 110.

As described above, according to the present invention, various types of errors are generated according to the user request, and the errors are inserted into the normal instruction to generate an error instruction and transmitted to the storage. Then, the data are read out from the storage to analyze the test result, so that various error characteristics such as the operating characteristic of the storage against errors and the operation to process the errors of the storage can be tested.

The present invention is not limited to the above-described embodiment, and may be variously modified by those skilled in the art to which the present invention pertains without departing from the spirit of the present invention and the modification falls within the scope of the present invention.

What is claimed is:

1. An error generating apparatus of a solid state drive tester, the error generating apparatus comprising:
a host terminal for receiving a test condition for a test of a storage from a user; and
a test control unit for creating a test pattern according to the test condition or creating a test pattern randomly, generating error data used to test an error characteristic of the storage, and testing the storage based on the test pattern and a specific instruction or an error instruction formed by inserting the error data into the specific instruction,
wherein the test control unit comprises:
an embedded processor for controlling the test of the storage and insertion of the error data;
an error generator for generating the error data to test the error characteristic of the storage; and
a test executing unit for generating the test pattern to test the storage according to a control of the embedded processor, transmitting the specific instruction generated from the embedded processor or the error instruction formed by inserting the error data into the specific instruction to the storage, reading out a test pattern from the storage, and comparing the stored test pattern with the generated test pattern in real time to process a test failure state.

2. The error generating apparatus of claim 1, wherein the test control unit further comprises:
a communication interface unit connected to the host terminal through a network to receive user information and to transmit a test result to the host terminal; and
a storage interface unit for interfacing the storage.

3. The error generating apparatus of claim 2, wherein the storage interface unit comprises a plurality of complex interfaces, and
wherein each complex interface comprises:
an advanced host controller interface unit for interfacing instruction data generated from the embedded processor;
a direct memory access unit for interfacing writing data generated from the embedded processor;
a serial-ATA transport layer for supporting a transport layer protocol for a serial-ATA interface between the advanced host controller interface unit and the storage, and between the direct memory access unit and the storage;
a serial attached SCSI transport layer for supporting a transport layer protocol for a serial attached SCSI interface between the advanced host controller interface unit and the storage, and between the direct memory access unit and the storage;
a PCI express transaction layer for supporting a transaction layer protocol for a PCI express interface between the advanced host controller interface unit and the storage, and between the direct memory access unit and the storage;
a serial attached SCSI port layer for performing a data interface between the serial attached SCSI transport layer and a link layer;
a sharing link layer for allowing the serial-ATA transport layer, the serial attached SCSI port layer, and the PCI express transaction layer to share a link layer protocol; and
a physical layer for performing a physical layer interface operating between the sharing link layer and the storage.

4. The error generating apparatus of claim 3, wherein the complex interface further comprises:
a serial-ATA transport layer error generator for generating error data of the serial-ATA transport layer under error insertion control of the embedded processor to transmit the error data to the serial-ATA transport layer;
a serial attached SCSI transport layer error generator for generating error data of the serial attached SCSI transport layer under the error insertion control of the embedded processor to transmit the error data to the serial attached SCSI transport layer;
a PCI express transaction layer error generator for generating error data of the PCI express transaction layer under the error insertion control of the embedded processor to transmit the error data to the PCI express transaction layer;
a serial attached SCSI port layer error generator for generating error data of the serial attached SCSI port layer under the error insertion control of the embedded processor to transmit the error data to the serial attached SCSI port layer;
a sharing link layer error generator for generating error data of the sharing link layer under the error insertion control of the embedded processor to transmit the error data to the sharing link layer; and
a physical layer error generator for generating error data of the physical layer under the error insertion control of the embedded processor to transmit the error data to the physical layer.

5. The error generating apparatus of claim 4, wherein the embedded processor transmits an error insertion control instruction to all of the serial-ATA transport layer error generator, the serial attached SCSI transport layer error generator, the PCI express transaction layer error generator, the serial attached SCSI port layer error generator, the sharing link layer error generator, and the physical layer error generator.

6. The error generating apparatus of claim 4, wherein the embedded processor selectively transmits an error insertion control instruction to a part of the serial-ATA transport layer error generator, the serial attached SCSI transport layer error generator, the PCI express transaction layer error generator, the serial attached SCSI port layer error generator, the sharing link layer error generator, and the physical layer error generator, such that only the selected error generator generates the error data, and the error data are inserted into a layer corresponding to the selected error generator.

7. The error generating apparatus of claim 1, wherein the test executing unit comprises:
- a pattern data generator for generating the pattern data by selecting one of the pattern data created according to the test condition and the randomly-created pattern data according to a pattern data selection signal output from the embedded processor;
- a buffer memory for temporarily storing data read out from the storage;
- a failure processor for comparing the pattern data generated from the pattern data generator with data read out from the buffer memory to determine the test failure state, and generating failure information when test failure occurs;
- a failure memory for storing the failure information generated from the failure processor;
- a specific instruction generator for generating the specific instruction to test the storage according to a test instruction generated from the embedded processor;
- an error instruction generator for generating the error instruction by inserting the error data according to the test instruction generated from the embedded processor; and
- an instruction selector for selecting and outputting the specific instruction generated from the specific instruction generator or the error instruction generated from the error instruction generator according to an instruction selection signal output from the embedded processor.

* * * * *